US007445690B2

United States Patent
Kasai et al.

(10) Patent No.: US 7,445,690 B2
(45) Date of Patent: Nov. 4, 2008

(54) PLASMA PROCESSING APPARATUS

(75) Inventors: Shigeru Kasai, Nirasaki (JP); Yuki Osada, Nirasaki (JP); Takashi Ogino, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 400 days.

(21) Appl. No.: 11/088,811

(22) Filed: Mar. 25, 2005

(65) Prior Publication Data

US 2005/0160987 A1 Jul. 28, 2005

Related U.S. Application Data

(63) Continuation of application No. PCT/JP03/12792, filed on Oct. 6, 2003.

(30) Foreign Application Priority Data

Oct. 7, 2002 (JP) ............................ 2002-293529

(51) Int. Cl.
*C23C 16/00* (2006.01)
*H01L 21/306* (2006.01)

(52) U.S. Cl. ........................ 156/345.41; 118/723 MW; 315/111.21

(58) Field of Classification Search ......... 118/723 MW, 118/723 MA, 723 ME, 723 MR, 723 AN; 156/345.36, 345.41, 345.42; 315/111.21, 315/111.41, 111.51, 111.71
See application file for complete search history.

(56) References Cited

U.S. PATENT DOCUMENTS

| | | | | |
|---|---|---|---|---|
| 3,912,546 | A * | 10/1975 | Hunsperger et al. | 438/174 |
| 5,874,706 | A | 2/1999 | Ishii et al. | |
| 6,080,270 | A | 6/2000 | Tabrez et al. | |
| 6,325,018 | B1 | 12/2001 | Hongoh | |
| 2004/0031288 | A1 * | 2/2004 | Blinov | 65/390 |

FOREIGN PATENT DOCUMENTS

| | | |
|---|---|---|
| AU | 1110801 | 9/2001 |
| JP | 8-337887 | 12/1996 |
| JP | 9-102400 | 4/1997 |
| JP | 11-274874 | 10/1999 |
| JP | 2001-257098 | 9/2001 |
| JP | 2002-50615 | 2/2002 |
| JP | 2002-260899 | 9/2002 |

* cited by examiner

*Primary Examiner*—Luz L. Alejandro
(74) *Attorney, Agent, or Firm*—Oblon, Spivak, McCelland, Maier & Neustadt, P.C.

(57) ABSTRACT

A plasma processing apparatus includes a chamber for containing a substrate to be processed, a gas supply unit for supplying a processing gas into the chamber, and a microwave introducing unit for introducing plasma generating microwaves into the chamber. The microwave introducing unit includes a microwave oscillator for outputting a plurality if microwaves having specified outputs, and an antenna section having a plurality of antennas to which the microwaves outputted from the microwave oscillator are respectively transmitted.

12 Claims, 7 Drawing Sheets

PLASMA PROCESSING APPARATUS

This application is a Continuation Application of PCT International Application No. PCT/JP03/12792 filed on Oct. 6, 2003, which designated the United States.

FIELD OF THE INVENTION

The present invention relates to a plasma processing apparatus for performing a plasma process such as an etching on a substrate to be processed.

BACKGROUND OF THE INVENTION

In a manufacturing process of a semiconductor device or a liquid crystal display device, a plasma processing apparatus such as a plasma etching apparatus and a plasma CVD film forming apparatus has been employed to perform a plasma process, e.g., an etching process or a film forming process, on a substrate to be processed such as a semiconductor wafer and a glass substrate.

There are well-known plasma generating methods used in the plasma processing apparatus, e.g., a method including steps of supplying a processing gas into a chamber with parallel plate electrodes disposed therein; feeding a specific power to the parallel plate electrodes; and generating a plasma by capacitive coupling between the electrodes and a method including steps of accelerating electrons by an electric field produced by a microwave which is introduced into a chamber and a magnetic field generated by a magnetic field generating unit which is installed outside the chamber; colliding the accelerated electrons with neutral molecules of a processing gas; and generating a plasma by ionization of the neutral molecules, or the like.

In the latter method utilizing a magnetron effect due to the electric field produced by the microwave and the magnetic field generated by the magnetic field generating unit, a predetermined specific power microwave is supplied to an antenna disposed in the chamber through a waveguide/coaxial tube so that the microwave is emitted into a processing space in the chamber.

FIG. 8 is an explanatory diagram showing a schematic configuration of a typical, conventional microwave introducing unit. The microwave introducing unit 90 includes a microwave oscillator 91 having a magnetron 91*a* for outputting a microwave whose power is regulated to be close to a predetermined specific value and a microwave generating power supply 91*b* for supplying an anode current of a predetermined frequency to the magnetron 91*a*; an antenna 94 for emitting a microwave which is outputted from the microwave oscillator 91 into a processing space in a chamber; an isolator 92 for absorbing a reflected microwave returning to the microwave oscillator 91 from the antenna 94; and a matcher 93 which has a tuner for performing matching for the antenna 94 to diminish a power of the reflected microwave and connects a waveguide to a coaxial tube (see, e.g., Japanese Patent No. 2722070 and Japanese Patent Laid-Open Application No. H8-306319).

However, the microwave oscillator 91 using the magnetron 91*a* has a drawback such as the high cost for the equipment and the maintenance thereof due to a short life of about half a year of the magnetron 91*a*. Further, since the magnetron 91*a* has oscillation stability of approximately 1% and output stability of approximately 3%, resulting in a large difference therebetween, it is difficult to transmit a stable microwave.

The present invention has been conceived to overcome the above drawbacks; and it is, therefore, an object of the present invention to provide a plasma processing apparatus provided with a microwave oscillator having a long life. Further, it is another object of the present invention to provide a plasma processing apparatus provided with a microwave oscillator capable of stably supplying a microwave.

First, in order to overcome the above drawbacks, the present inventors have proposed a plasma processing apparatus for amplifying the microwave to have a predetermined specific output by using a semiconductor amplifying device (Patent Application No. 2002-288769, hereinafter, referred to as "prior application"). FIG. 7 is an explanatory diagram showing a schematic configuration of a microwave introducing unit provided with a microwave oscillator using a semiconductor amplifying device of the prior application.

The microwave introducing unit 80 includes a microwave oscillator 80*a* for oscillating to generate the microwave of a predetermined specific power; an isolator 85 for absorbing a microwave, among the microwaves outputted from the microwave oscillator 80*a*, which returns to the microwave oscillator 80*a* from the antenna 87; an antenna 87 provided in a chamber for emitting a microwave which is outputted through the isolator 85 into a processing space in the chamber; and a matcher 86 for performing matching for the antenna 87 to reduce the microwave reflected from the antenna 87.

Further, the microwave oscillator 80*a* includes a microwave generator 81 for generating the microwave; a divider 82 for dividing the microwave outputted from the microwave generator 81 into a plurality of microwaves, e.g., into four to be distributed along four paths as shown in FIG. 7; four solid state amplifiers 83, each amplifying a corresponding one of four path microwaves outputted from the divider 82 to have a predetermined specific power; and a combiner 84 for combining the four amplified microwaves respectively amplified in solid state amplifiers 83.

The microwave generator 81 has a microwave generating source (generator) 81*a* for generating a microwave of a predetermined frequency (e.g., 2.45 GHz) and a variable attenuator 81*b* for attenuating a power of the microwave generated by the microwave generating source 81*a* to a specified level.

Each solid state amplifier 83 has a sub-divider 83*a* for further dividing an input microwave into a plurality of microwaves (four shown in FIG. 7); a plurality of semiconductor amplifying devices 83*b* for amplifying the respective microwaves outputted from the sub-divider 83*a* to have respectively predetermined specific powers; a sub-combiner 83*c* for combining amplified microwaves outputted from semiconductor amplifying devices 83*b*.

By using such microwave introducing unit wherein each semiconductor amplifying device 83*b* performs power amplification, the apparatus becomes semipermanent and a microwave of a stable output power can be emitted into the chamber.

However, in such microwave introducing unit 80, there is a need to perform impedance matching in the divider 82 and the combiner 84, in addition to impedance matching in the solid state amplifier 83. In case of impedance mismatching, power loss can be increased. Particularly, there is a need to transmit the microwave of 2 to 3 kW to, e.g., the antenna 87 in a plasma processing apparatus and the combiner 84 is required to combine the microwaves of large power in the microwave introducing unit 80. For this reason, especially, in the combiner 84, a more precise impedance matching is required to suppress the power loss of the microwave.

Further, in order to transmit the large power microwave outputted from the combiner 84 to the isolator 85, the isolator 85 needs to be large-sized in a few KW range, resulting in restricting the place where the isolator 85 is to be installed and further resulting in a high cost for the isolator 85 itself. Furthermore, since the combined microwave is transmitted to the antenna 87 through a single coaxial tube, it is not possible to control the distribution of the microwave outputted from the antenna 87.

SUMMARY OF THE INVENTION

It is, therefore, an object of the present invention to overcome such drawbacks of the microwave introducing unit in the above-mentioned prior application, that is, an increase in transfer loss, an oversized unit for supplying the microwave, and the loss of control over power distribution of the emitted microwave.

In accordance with the present invention, there is provided a plasma processing apparatus, including a chamber for containing a substrate to be processed; a gas supply unit for supplying a processing gas into the chamber; and a microwave introducing unit for introducing plasma generating microwaves into the chamber, the microwave introducing unit having a microwave oscillator for outputting a plurality of microwaves having specified outputs; and an antenna section having a plurality of antennas to which the microwaves outputted from the microwave oscillator are respectively transmitted.

In accordance with the present invention, since the microwaves are transmitted to respective antennas included in the antenna section, it is not necessary to combine high power microwaves in the transmission line leading to the antenna section. Thus, a combiner is not needed to thereby be able to completely avoid the power loss due to the combiner. Further, since it is possible to lower the powers of microwaves transmitted to respective antennas, there is no need to use an isolator for a high power. Accordingly, the microwave oscillator need not be large-sized. Further, since microwaves having different powers from each other can be supplied to a plurality of antennas included in the antenna section, it becomes possible to control the output distribution of the microwave emitted from the antenna.

Preferably, the microwave oscillator has a microwave generator for generating a low power microwave; a divider for dividing the microwave generated from the microwave generator into a plurality of microwaves; and a plurality of amplifier sections for amplifying respective microwaves divided by the divider to specified powers, wherein a plurality of microwaves outputted from the plurality of amplifier sections are respectively transmitted to the plurality of antennas.

In this case, if each of the plurality of amplifier sections has a variable attenuator for attenuating a microwave outputted from the divider to a predetermined level; a solid state amplifier for amplifying a microwave outputted from the variable attenuator to a specified power; an isolator for separating a reflected microwave returning to the solid state amplifier from a microwave which is outputted from the solid state amplifier to the antenna; and a matcher for regulating a power of the reflected microwave, microwaves of different powers can be supplied to respective antennas by regulating an attenuation rate in each variable attenuator. Accordingly, it is possible to control the distribution of a plasma generated in the chamber.

The isolator may have a dummy load for converting the reflected microwave into heat; and a circulator for leading a microwave outputted from the solid state amplifier to the antenna and leading a reflected microwave from the antenna to the dummy load.

In this case, the power of the microwave outputted from a single solid state amplifier is not extremely large such that it is possible to use a small-sized isolator to thereby cut down on manufacturing costs of the apparatus.

The solid state amplifier has a sub-divider for dividing an input microwave into a multiplicity of microwaves; a multiplicity of semiconductor amplifying devices for respectively amplifying the multiplicity of microwaves outputted from the sub-divider to respectively specified powers; and a combiner for combining microwaves whose powers are amplified by the multiplicity of semiconductor amplifying devices. As the semiconductor amplifying devices, power MOSFETs, GaAs-FETs, GeSi transistors or the like are used appropriately.

Since a power of a low power microwave is amplified by a semiconductor amplifying device without using a magnetron, the amplifier section can be semipermanent. Consequently, equipment costs and maintenance costs can be cut down. Further, the semiconductor amplifying device has an excellent output stability and therefore a stable microwave can be emitted into the chamber. Thus, a plasma is generated in a satisfactory condition, thereby improving quality in processing the substrate. Furthermore, in this case, a range of output control for the amplifier section is wide (0 to 100%) and the control becomes easy.

The antenna section may has a circular antenna provided at a center thereof; plural approximately fan-shaped antennas which surrounds a periphery of the circular antenna; and a dividing plate for dividing the circular antenna and the plural approximately fan-shaped antennas from each other. Each antenna may have a wave delay plate, a cooling plate and a slot plate. Further, it is preferable that the dividing plate is a metal member and grounded.

In this case, it is preferable that the circular antenna is provided with first slots of a predetermined length disposed along a circle located inwardly by $\lambda g/4$ from the periphery of the circular antenna and second slots of a specified length disposed on one or more concentric circles located inwardly at intervals of $\lambda g/2$ from the first slots. Further, it is preferable that each of the plural approximately fan-shaped antennas is provided with third slots of a preset length located inwardly by $\lambda g/4$ from respective boundaries between the approximately fan-shaped antennas and fourth slots of a specific length located inwardly at intervals of $\lambda g/2$ from the third slots. Thus, the microwave can be effectively emitted into the chamber.

BRIEF DESCRIPTION OF THE DRAWINGS

The above and other objects and features of the present invention will become apparent from the following description of preferred embodiments, given in conjunction with the accompanying drawings, in which.

DETAILED DESCRIPTION OF THE PREFERRED EMBODIMENTS

Figure 1:
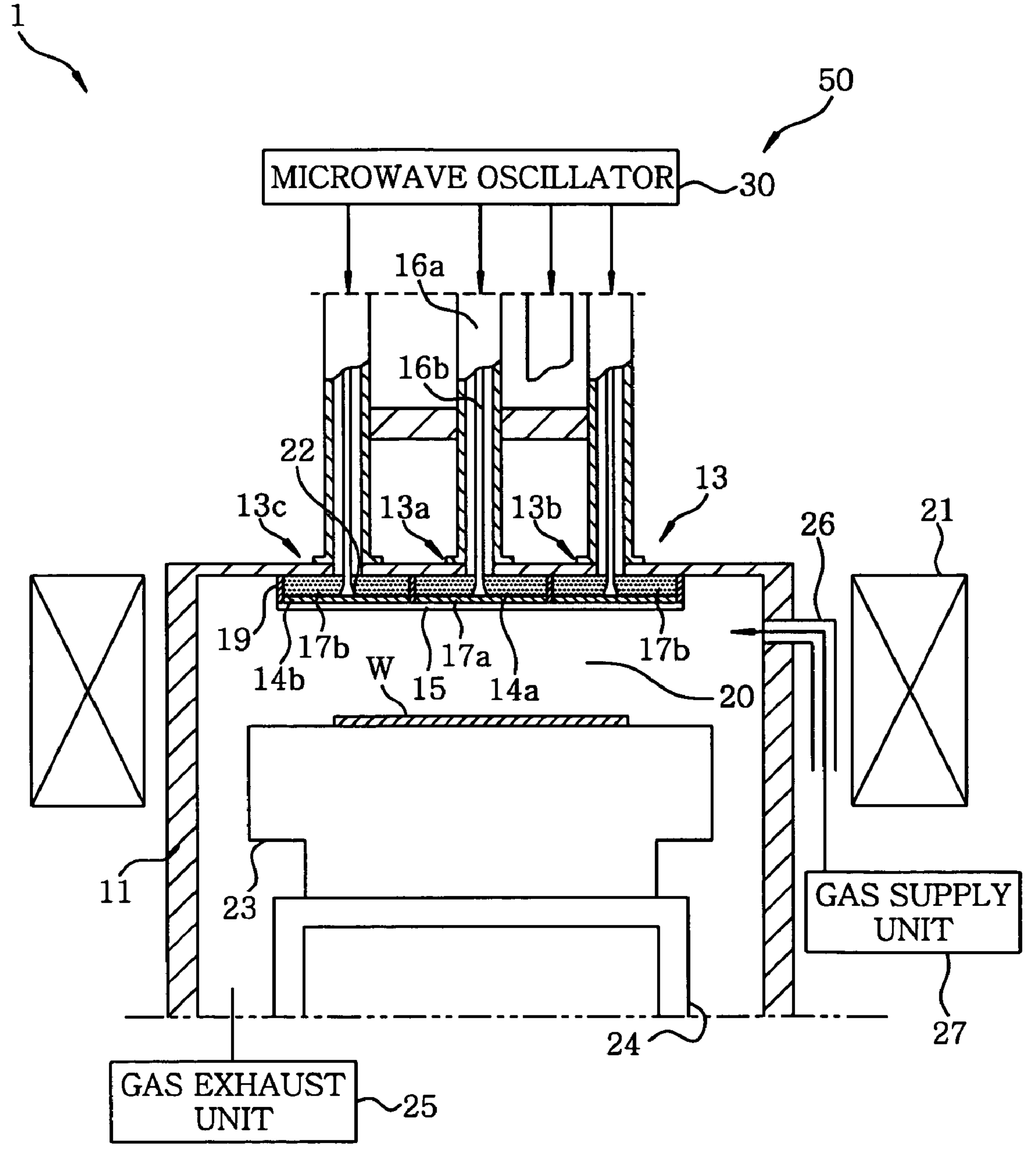
FIG. 1 shows a schematic cross sectional view of a plasma etching apparatus in accordance with a preferred embodiment of the present invention.
Figure 2:
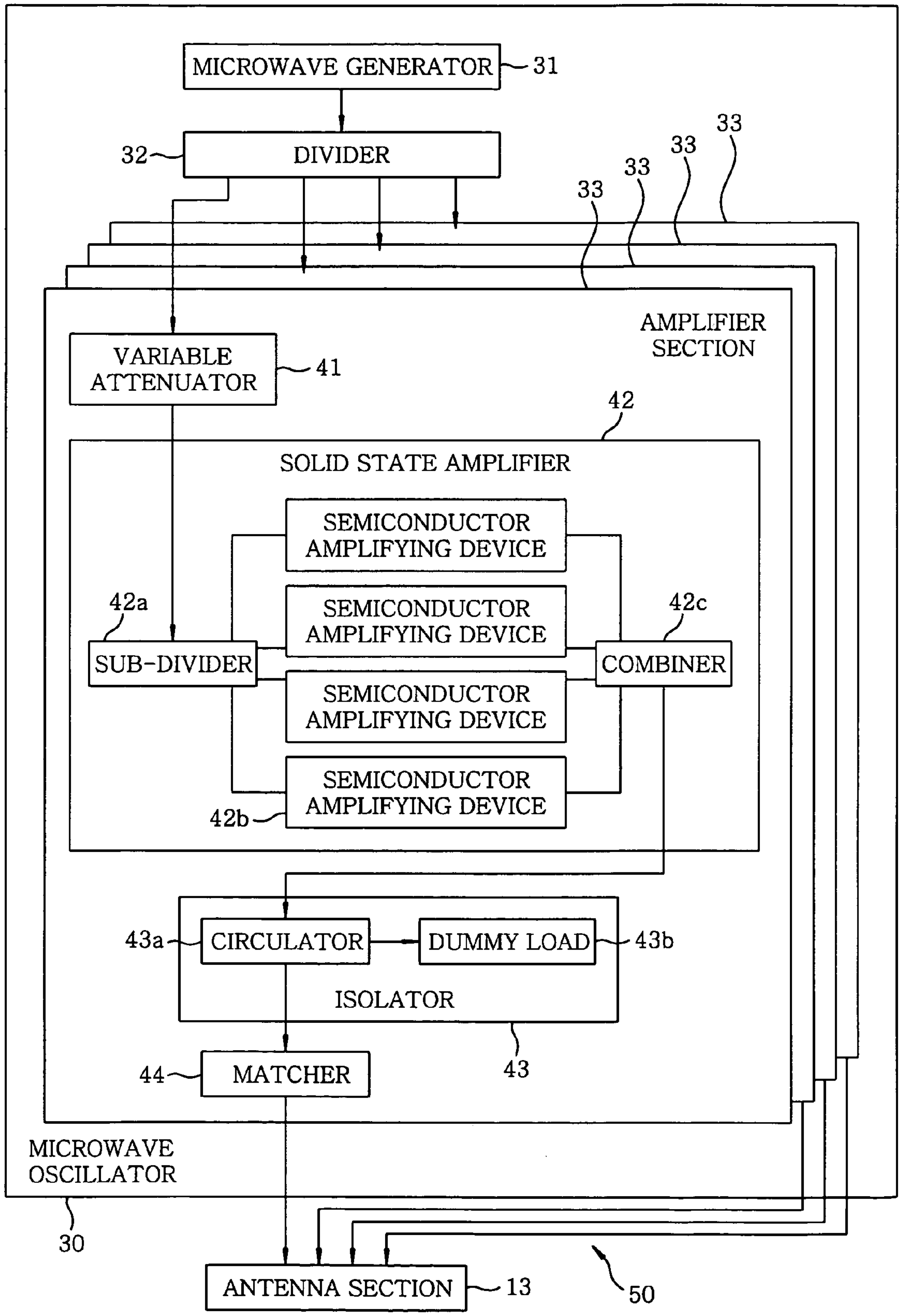
FIG. 2 is an explanatory diagram showing a configuration of a microwave introducing unit installed in the plasma etching apparatus shown in FIG. 1.

Hereinafter, preferred embodiments of the present invention will be described with reference to the accompanying drawings. FIG. 1 shows a schematic cross sectional view of a plasma etching apparatus 1 as an example of a plasma processing apparatus. FIG. 2 is an explanatory diagram showing a detailed configuration of a microwave introducing unit 50 installed in the plasma etching apparatus 1. Further, in the plasma etching apparatus 1, a substrate to be processed is a semiconductor wafer W.

The plasma etching apparatus 1 includes a chamber 11 for containing the wafer W therein; a gas inlet opening 26 provided in the chamber 11; a gas supply unit 27 which supplies a processing gas (e.g., $Cl_2$) for producing a plasma into the chamber 11 through the gas inlet opening 26; a gas exhaust port 24 installed in the chamber 11; a gas exhaust unit 25 for exhausting an inside of the chamber 11 through the gas exhaust port 24; a substrate support stage 23 for supporting the wafer W in the chamber 11; an air core coil 21 for generating a magnetic field in a processing space 20 inside the chamber 11; and the microwave introducing unit 50 for supplying a microwave into the chamber 11.

The microwave introducing unit 50 includes a microwave oscillator 30 for outputting a plurality of microwaves (four paths shown in FIGS. 1 and 2,), each having a predetermined output, and an antenna section 13 having antennas 13*a*, 13*b*, 13*c* and 13*d* (the antenna 13*d* not shown in FIG. 1) for respectively being fed with the microwaves outputted from the microwave oscillator 30.

The microwave oscillator 30 includes a microwave generator 31 for generating a low power microwave; a divider 32 for dividing the microwave outputted from the microwave generator 31 into a plurality of microwaves (four shown in FIG. 2); a plurality of amplifier sections 33 (four amplifier sections 33 shown in FIG. 2) for amplifying respective microwaves from the divider 32 to have a predetermined specific power. The microwaves outputted from the four amplifier sections 33 are respectively transferred to feeding points 60*a*, 60*b*, 60*c* and 60*d* respectively provided in the antennas 13*a* to 13*d* (see FIG. 3).

The microwave generator 31 generates the microwave of a predetermined frequency (e.g., 2.45 GHz). The divider 32 divides the microwave during impedance matching between an input side and an output side such that any loss of the microwave rarely occurs.

As shown in FIG. 2, each amplifier section 33 includes a variable attenuator 41 for attenuating the microwave outputted from the divider 32 to a predetermined level; a solid state amplifier 42 for amplifying the microwave outputted from the variable attenuator 41 to have a predetermined specific power; an isolator 43 for separating a reflected microwave returning to the solid state amplifier 42 from the microwave which is outputted from the solid state amplifier 42 to each antenna 13*a* to 13*d*; a matcher 44 for regulating a power of the reflected microwave.

The variable attenuator 41 regulates a power level of the microwave which is inputted to the solid state amplifier 42. That is, an attenuation level is regulated in the variable attenuator 41 such that the power of the microwave outputted from the solid state amplifier 42 is regulated.

The variable attenuator 41 is individually installed in each of the four amplifier sections 33. Accordingly, attenuation rates of the variable attenuators 41 are individually changed, whereby powers of the microwaves outputted from the four amplifier sections 33 can be different from one another. In other words, the microwave oscillator 30 can supply the microwaves of different powers to the antennas 13*a* to 13*d*, respectively. Thus, plasmas of various distributions as well as a uniform plasma can be generated in the chamber 11.

The solid state amplifier 42 includes a sub-divider 42*a* for further dividing the input microwave into a plurality of microwaves (four shown in FIG. 2); semiconductor amplifying devices 42*b* for amplifying the microwaves outputted from the sub-divider 42*a* to have respective predetermined specific powers; and a combiner 42*c* for combining the amplified microwaves that are outputted from semiconductor amplifying devices 42*b*.

The sub-divider 42*a* has the same configuration as the divider 32. For example, Power MOSFET is employed as the semiconductor amplifying device 42*b*. A maximum power of the microwave outputted from one semiconductor amplifying device 42*b* is, e.g., 100 W to 150 W, whereas a total power of the microwave that needs to be supplied to the antenna section 13 is generally 1000 to 3000 W. Thus, the attenuation rate of the variable attenuator 41 in each amplifier section 33 can be regulated such that average 250 to 750 W microwaves are transmitted to the antennas 13*a* to 13*d*, respectively.

The combiner 42*c* combines the microwaves outputted from respective semiconductor amplifying devices 42*b* during impedance matching. At this time, circuits such as Wilkinson type, Branch line type, and Sorter balun type can be used as the matching circuit.

The microwaves outputted from the solid state amplifiers 42 are sent to respective antennas 13*a* to 13*d* in the antenna section 13 through the respective isolators 43 and the matchers 44. At this time, portions of the microwaves return (are reflected and come) to the respective solid state amplifiers 42 from the antennas 13*a* to 13*d*. Each isolator 43 has a circulator 43*a* and dummy load 43*b*, and the circulator 43*a* leads the reflected microwave going back to the solid state amplifier 42 from a corresponding one of the antennas 13*a* to 13*d* to the dummy load (coaxial termination) 43*b*. The dummy load 43*b* converts the reflected microwave led by the circulator 43*a* into heat.

Figure 7:
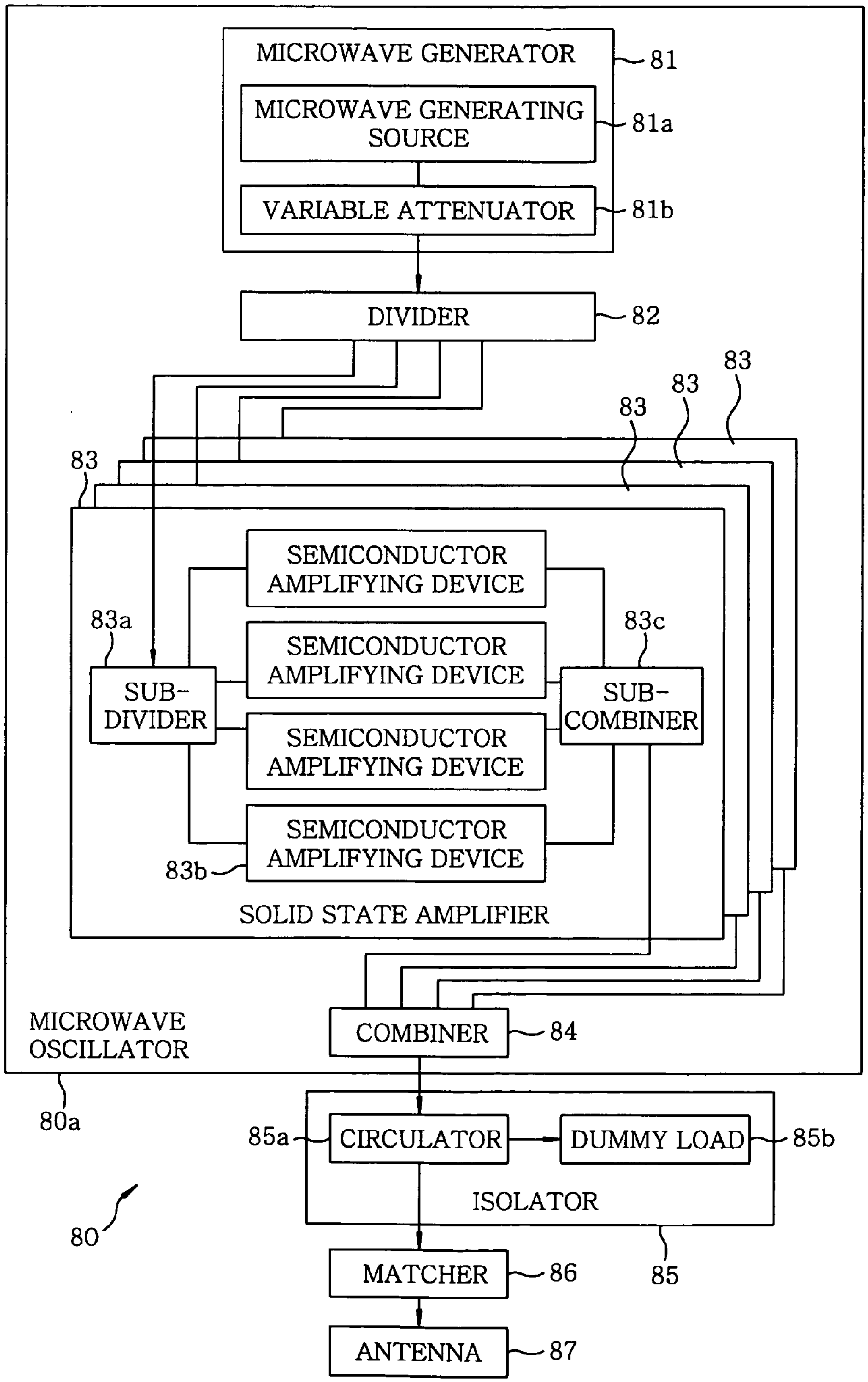
FIG. 7 (PRIOR ART)
FIG. 7 represents an explanatory diagram showing a schematic configuration of a microwave introducing unit provided with a microwave oscillator using a semiconductor amplifying device.
Figure 8:
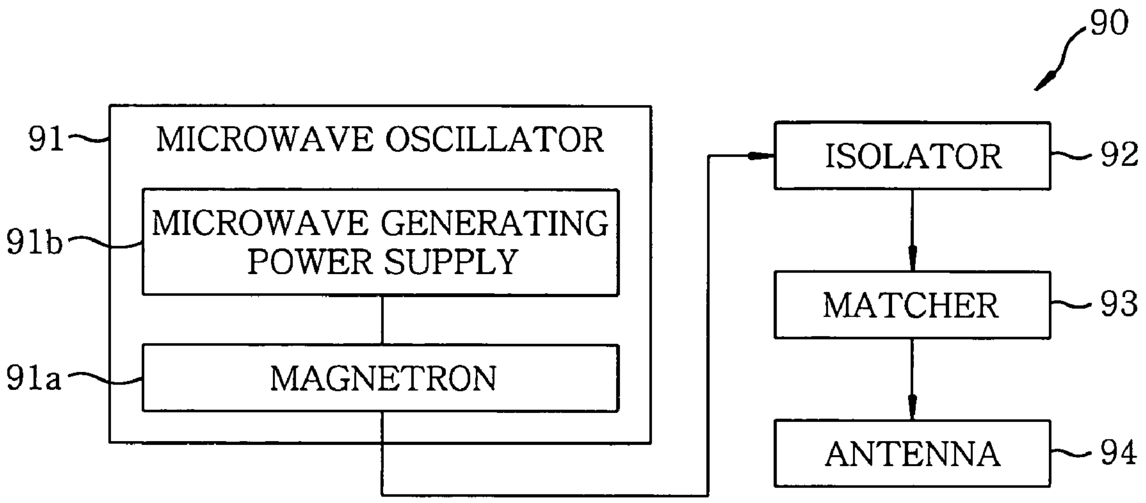
FIG. 8 (PRIOR ART)
FIG. 8 sets forth an explanatory diagram showing a configuration of a conventional microwave introducing unit.

As described with reference to FIG. 7, when the microwaves, each amplified by the solid state amplifier 83 to have a specified power, are combined and then pass through the isolator 85, the isolator 85 is required to endure a few kW power, which in turn makes the isolator 85 large-sized and expensive. However, in accordance with the microwave oscillator 30 of the present embodiment, the microwaves amplified by the solid state amplifiers 42 to have respectively specified powers are not combined and pass through the isolator 43 as they are and, further, the power of the microwave outputted from each solid state amplifier 42 is not extremely large. Therefore, the isolator 43 can be small-sized to thereby cut down on manufacturing costs of the apparatus.

The matcher 44 has a tuner for performing matching on a corresponding one of the antennas 13*a* to 13*d* in order to reduce the reflected microwave led to the dummy load 43*b*. The microwaves are respectively transferred from the matchers 44 to feeding points 60*a* to 60*d* provided in the antennas 13*a* to 13*d* through outer conductive coaxial tubes 16*a* and inner conductive coaxial tubes 16*b* (see FIG. 1). The inner conductive coaxial tubes 16*b* have taper portions 22 in end portions of the antennas 13*a* to 13*d* for suppressing/decreasing the reflection of the microwaves.

Figure 3:
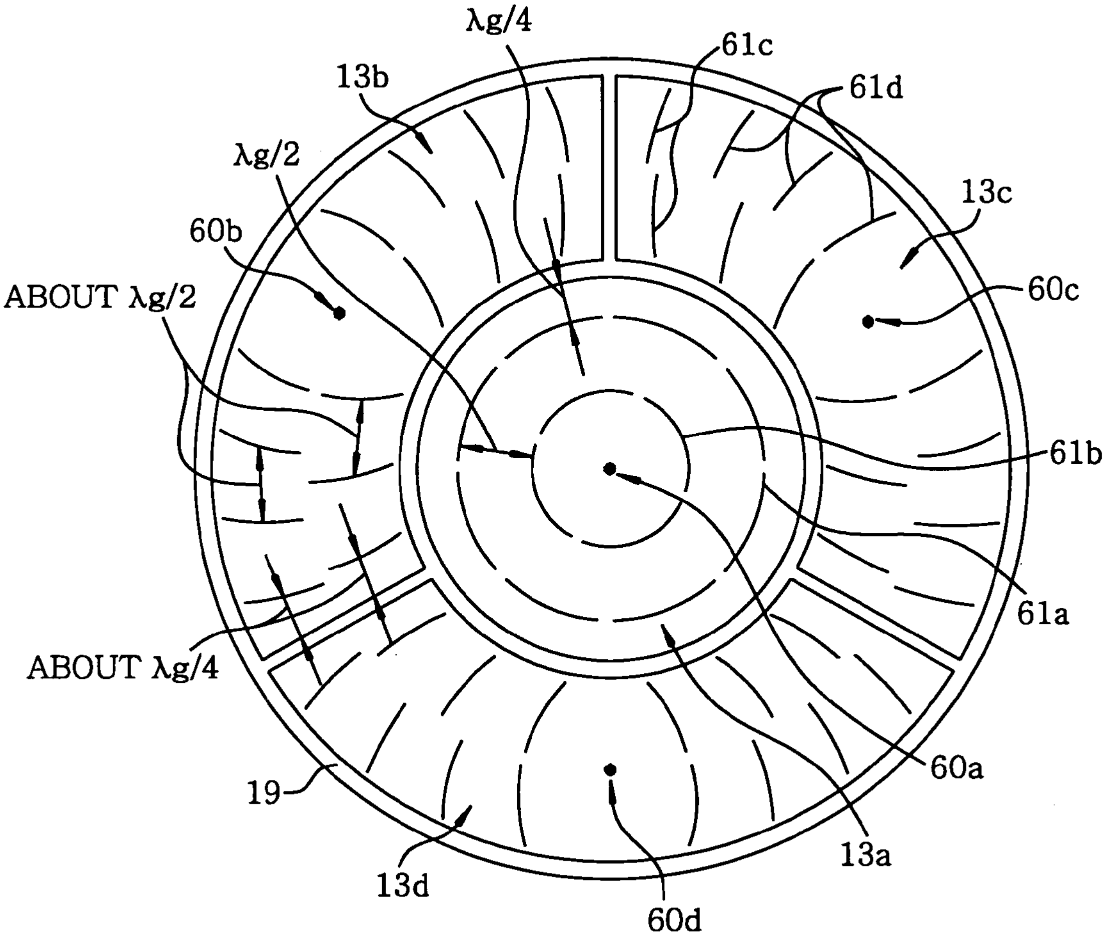
FIG. 3 explains a plan view of an antenna.

FIG. 3 is an explanatory diagram showing a plan view of the antenna section 13. A disc shaped antenna section 13 includes a circular antenna 13*a* at a center thereof; three antennas 13*b* to 13*d* which are approximately fan-shaped and surround a periphery of the antenna 13*a*; and a dividing plate 19 for dividing the respective antennas 13*a* to 13*d*. In other words, the antenna section 13 has a structure wherein a conventional disc shaped antenna is divided into four antennas 13*a* to 13*d* by the dividing plate 19. Further, the feeding points 60*a* to 60*d* (portions attached to the outer conductive coaxial tubes 16*a* and the inner conductive coaxial tubes 16*b*) are installed at respective spots in the antennas 13*a* to 13*d*.

As shown in FIG. 1, the antenna 13*a* has a slot plate 14*a* made of metal with slots (not shown in FIG. 1) for emitting the microwave at specified position and a wave delay plate 17*a* made of aluminum nitride. In the same way, each of the antennas 13*b* to 13*d* has a slot plate 14*b* with slots (not shown in FIG. 1) and a wave delay plate 17*b*. Further, the wave delay plates 17*a* and 17*b* also serve as a cooling plate. Furthermore, the antenna section 13 has a microwave transmissive insulating plate 15 for preventing slot plates 14*a*, 14*b* from directly contacting with a plasma generated in the processing space 20.

It is preferable that the dividing plate 19 is a metal member and grounded. The microwaves supplied to the antennas 13*a* to 13*d* via the feeding points 60*a* to 60*d*, respectively, are totally reflected while phases thereof are rotated 180 degrees by the dividing plate 19. In short, the microwaves are not transferred among the antennas 13*a* to 13*d*. Each of the antennas 13*a* to 13*d* independently emits the microwave into the processing space 20. The microwave is reflected by the dividing plate 19 to thereby generate a standing wave on each of the wave delay plates 17*a* and 17*b*. Thus, when narrow and long slots perpendicular to proceeding directions of the standing waves are formed at positions of the slot plates 14*a*, 14*b* corresponding to antinodes in the standing waves, the microwave can be emitted into the processing space 20 effectively by the slots.

FIG. 3 shows positions of slots 61*a* and 61*b* provided on the slot plate 14*a* of the antenna 13*a* and slots 61*c* and 61*d* provided on the slot plates 14*b* of the antennas 13*b* to 13*d*. Further, for convenience sake, the slots 61*a* to 61*d* are indicated by solid lines in FIG. 3, but, in reality, the slots 61*a* to 61*d* are holes with specified widths, respectively.

Let a wavelength of the microwave be $\lambda_1$; and a relative dielectric constant of the wave delay plates 17*a* and 17*b*, $\in_r$; and define $\lambda g=\lambda_1/\in_r^{1/2}$. As shown in FIG. 3, in the circular antenna 13*a*, it is preferable to arrange the slots 61*a* of a predetermined length on a concentric circle located inwardly by about λg/4 from a periphery of the antenna 13*a* and the slots 61*b* of a specified length on one or more concentric circles located inwardly at intervals of about λg/2 from the slots 61*a*. Further, in an approximately fan-shaped antennas 13*b* to 13*d*, it is preferable to arrange the slots 61*c* of a predetermined length at positions located inwardly by about λg/4 from boundaries between the antennas 13*b* to 13*d*; and the slots 61*d* of a specified length at positions located inwardly at intervals of about λg/2 from the slots 61*c*. The positions of the slots 61*a* to 61*d* almost coincide with the above-mentioned antinodes of the standing wave.

The microwaves emitted from the slots 61*a* to 61*d* formed on the slot plates 14*a* and 14*b* pass through the microwave transmissive insulating plate 15 and then reach the processing space 20 to form an electric field of the microwaves therein. At the same time, when a magnetic field is generated in the processing space by operating the air core coil 21, a plasma can be produced effectively by a magnetron effect. However, the air core coil 21 is not necessarily needed and a plasma can be also generated only by the microwaves emitted from the antenna section 13.

In accordance with the plasma etching apparatus 1 of the present embodiment, since the microwave having a stable power can be supplied to the processing space 20 by the microwave introducing unit 50, a plasma can be generated stably in the processing space 20 to thereby improve the processing quality of the wafer W. Further, the microwave can be emitted with a predetermined power distribution such that a plasma can be produced with a predetermined specific distribution. For example, a process can be performed by a plasma having a density in a central portion different from that in a peripheral portion.

As for an outside diameter of the entire antenna section 13, a shape of each of antennas 13*a* to 13*d*, a position of each slot, a general technique for designing a disc shaped antenna can be employed. Hereinafter, a method for designing a disc shaped antenna will be described in brief.

Figure 4:
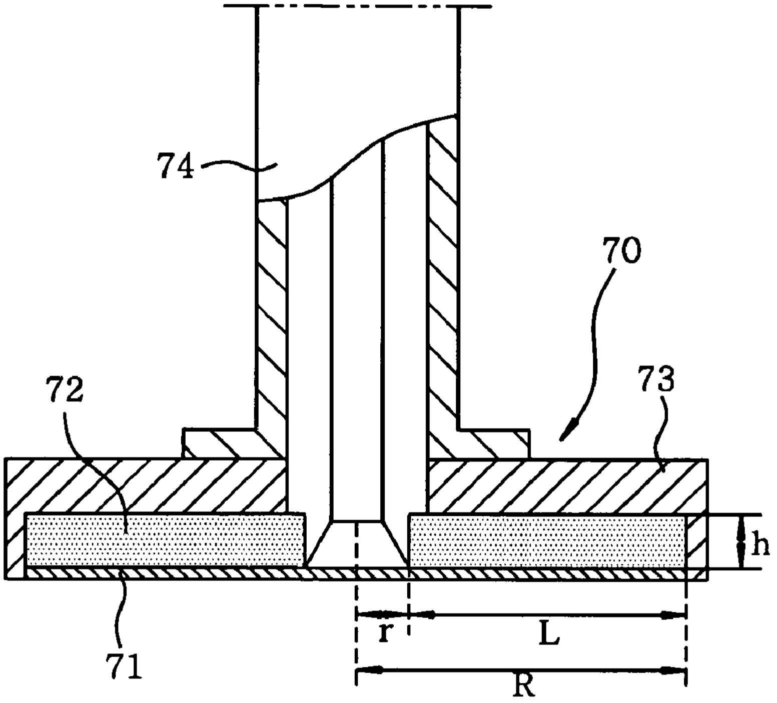
FIG. 4 describes a schematic cross sectional view of a disc shaped antenna.

FIG. 4 is a schematic cross sectional view of a disc shaped antenna 70. The disc shaped antenna 70 includes a slot plate 71, a wave delay plate 72, a cooling plate 73 and a coaxial tube 74. The cooling plate 73 covers a peripheral area of the wave delay plate 72 and reflects inwardly a microwave that reaches the peripheral area of the wave delay plate 72.

The wave delay plate 72 is flat ring shaped and has an inside diameter of 2×r, an outside diameter of 2×R and a thickness of h. When $\lambda_1$ and $\in_r$ designate a wavelength of the microwave and a relative dielectric constant of the wave delay plate 72 respectively and λg is defined as $\lambda g=\lambda_1/\in_r^{1/2}$, it is preferable that a width L (=R−r) of the wave delay plate 72 is approximately an integer multiple of λg. In this case, the periphery of the wave delay plate 72 corresponds to nodes of the standing wave and a first concentric circle located inwardly by λg/4 from a periphery of the wave delay plate 72 and a second concentric circle located inwardly by λg/2 from the first concentric circle correspond to positions of antinodes of the standing wave. It is preferable that positions of slots in the slot plate 71 are formed to be matched to positions of antinodes of the standing wave. Accordingly, even if characteristic impedance of the coaxial tube 74 does not correspond to that of the wave delay plate 72, it is possible to minimize the power of the reflected microwave that returns to the matcher from the antenna 70.

The thickness h of the wave delay plate 72 can be found as follows. For example, when WX-39D (EIAJ (Electronic Industries Association of Japan) Standards) is used as the coaxial tube 74, the inside diameter 2r of the wave delay plate 72 becomes 38.8 mm. The characteristic impedance of the coaxial tube 74 is generally 50 Ω, whereas the characteristic impedance Zo of parallel plate line is given by the following Equation (1). Thus, the thickness h of the wave delay plate 72 can be obtained as shown in the following Equation (2). Further, ∈ is an average dielectric constant of aluminum nitride and μ is a permeability of aluminum nitride. Here, since the aluminum nitride is an insulating material, a relative permeability $\mu_r$ is 1.

$$Zo = \frac{h}{2\pi r}\sqrt{\frac{\mu}{\varepsilon}} = \frac{h}{2\pi r}\cdot 377\cdot\frac{\sqrt{\mu_r}}{\sqrt{\varepsilon_r}} = \frac{h}{2\pi r}\cdot\frac{377}{\sqrt{\varepsilon_r}} \tag{1}$$

$$h = \frac{\sqrt{8.4}}{377}\times 38.8\times 3.14\times 50 \approx 46.83 \text{ (mm)} \tag{2}$$

Figure 5:
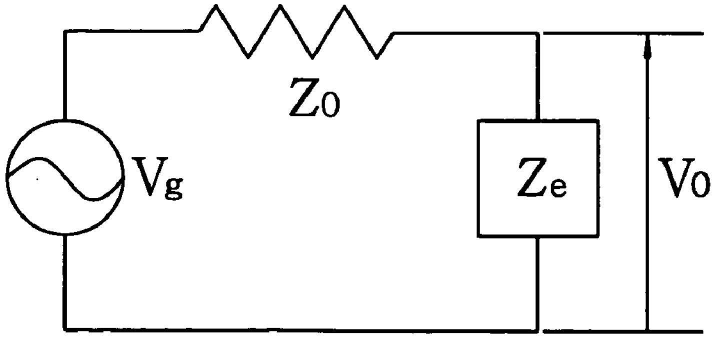
FIG. 5 illustrates one example of an equivalent circuit for use in impedance matching.

Hereinafter, a method of impedance matching in the antenna 70 will be described. In a circuit shown in FIG. 5, let a voltage of a power supply be Vg; characteristic impedance of the line, Zo; and load impedance, Ze. A voltage Vo of a loading point is calculated by Equation (3), and a reflection coefficient Γ is given by the following Equation (4).

$$Vo = \left(\frac{Ze - Zo}{Ze + Zo} + 1\right)Vg \tag{3}$$

$$\Gamma = \frac{Ze - Zo}{Ze + Zo} \tag{4}$$

In order to improve the efficiency of consumption of the energy of the transmitted microwave in the load, it is necessary to have Ze=Zo. That is, a combined impedance of the load and the matcher needs to be identical to a characteristic impedance of the transmission line. But, an ignition voltage Vs to ignite the plasma is obtained by the following Equation (5) describing a relation between pressure P and gap (discharge distance) L based on Paschen's law.

$$Vs = f(p \cdot L) \tag{5}$$

When the gap L is fixed, the ignition voltage is determined from the Equation (5). Further, from the Equation (3), when Ze is greater than Zo (Ze>Zo), it is feasible to make the voltage Vo of the loading point higher.

Figure 6:
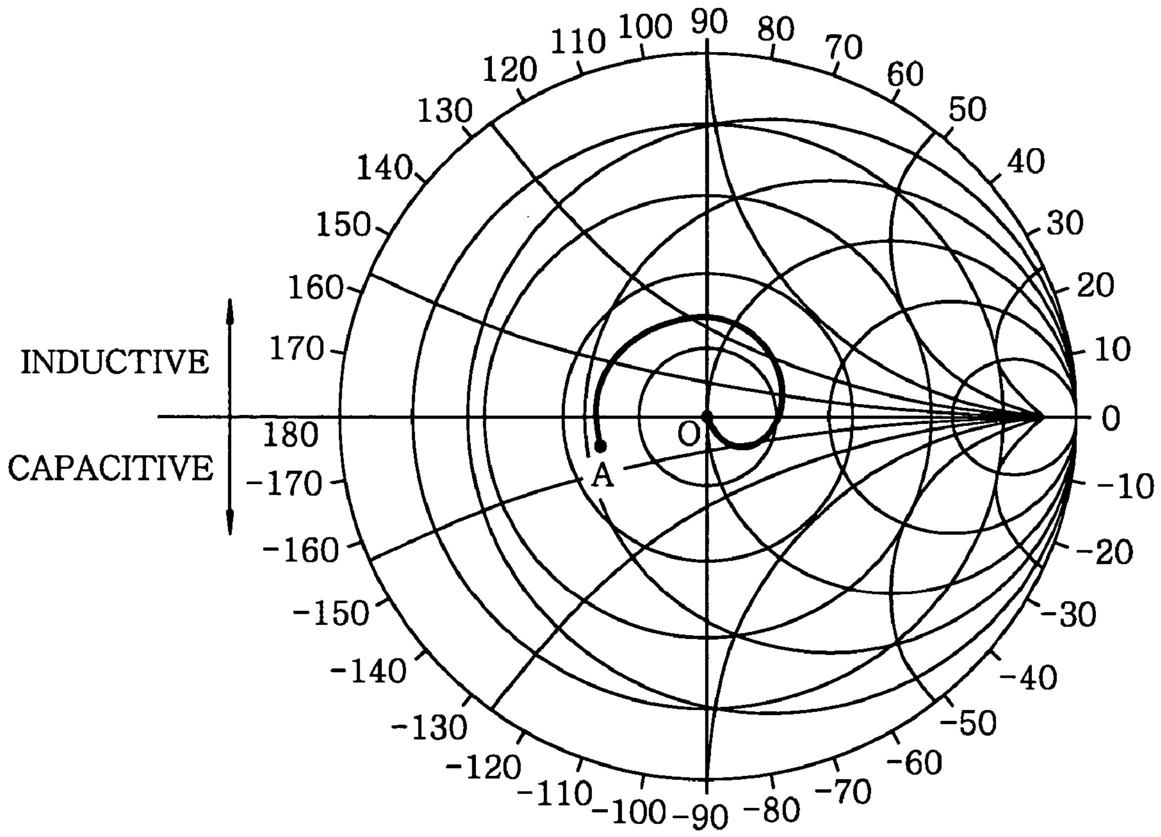
FIG. 6 offers an explanatory diagram (Smith chart) showing impedance change in plasma ignition and in a process.

Therefore, for example, in order to shorten a processing time, as shown in Smith chart of FIG. 6, it is preferable to move the impedance from a point A to a central point O through an inductive area to generate a proper inductive reflection when igniting the plasma and maintain the impedance in the central point O (an impedance matching position) in a process after the plasma ignition.

As described above, even though the present invention has been described in accordance with the above embodiment, it is not limited thereto. For example, a circuit configuration of the microwave oscillator 30 or a circuit configuration of the solid state amplifier 42 can be varied without being limited to that shown in FIG. 2.

For example, when it is not necessary to make the distribution of the microwave emitted from the antenna section 13 non-uniform, areas of the antennas 13*a* to 13*d*, from which the microwaves are emitted, are made equal to each other to thereby provide a variable attenuator between the microwave generator 31 and divider 32 without providing the variable attenuator 41 in each amplifier section 33. Consequently, the number of variable attenuators used as components can be decreased.

Further, when microwaves of different powers are transmitted to the antennas 13*a* to 13*d*, it is possible to use amplifier sections including solid state amplifiers, each having different number of semiconductor amplifying devices. For example, an amplifier section including a solid state amplifier having four semiconductor amplifying devices can be employed to transfer a 600 W microwave to the antenna 13*a*, whereas amplifier sections including solid state amplifiers having two semiconductor amplifying devices 42 can be employed to transfer 300 W microwaves to the antennas 13*b* to 13*d*.

The antenna section 13 is not limited to the one including four antennas 13*a* to 13*d* and may include more or less than four antennas. Further, an antenna is not limited to be circular or approximately fan-shaped as shown in FIG. 3. In case of an antenna section including larger number of antennas, the number of amplifier sections needs to be increased accordingly, but the amplifier section can be small-sized since the power of the microwave output from each amplifier section becomes lower.

An etching process has been described as an example of a plasma process, but the present invention can be applied to another plasma process such as a plasma CVD process (a film-forming process, reforming of oxynitride film and the like) and an ashing process. In this case, a processing gas suitable for an object of a process may be supplied into the chamber 11. Further, a substrate to be processed is not limited to a semiconductor wafer W and may be an LCD substrate, a glass substrate, a ceramic substrate and the like.

While the invention has been shown and described with respect to the preferred embodiments, it will be understood by those skilled in the art that various changes and modifications may be made without departing from the spirit and scope of the invention as defined in the following claims.

What is claimed is:

1. A plasma processing apparatus, comprising:
- a chamber for containing a substrate to be processed;
- a gas supply unit for supplying a processing gas into the chamber; and
- a microwave introducing unit for introducing plasma generating microwaves into the chamber, the microwave introducing unit including:
  - a microwave oscillator for outputting a plurality of microwaves having specified outputs; and
  - an antenna section having a plurality of antennas to which the microwaves outputted from the microwave oscillator are respectively transmitted,
- wherein the microwave oscillator has:
  - a microwave generator for generating a low power microwave;
  - a divider for dividing the microwave generated from the microwave generator into a plurality of microwaves; and
  - a plurality of amplifier sections for amplifying respective microwaves divided by the divider to specified powers, and
- wherein a plurality of microwaves outputted from the plurality of amplifier sections are respectively transmitted to the plurality of antennas, and
- wherein each of the plurality of amplifier sections has:
  - a variable attenuator for attenuating a microwave outputted from the divider to a predetermined level;
  - a solid state amplifier for amplifying a microwave outputted from the variable attenuator to a specified power; and
  - a matcher for regulating a power of a reflected microwave returning to the solid state amplifier from the antenna.

2. The plasma processing apparatus of claim 1, wherein each of the plurality of amplifier sections further has an isolator for separating the reflected microwave returning to the solid state amplifier from a microwave which is outputted from the solid state amplifier to the antenna.

3. The plasma processing apparatus of claim 2, wherein the isolator has:
- a dummy load for converting the reflected microwave into heat; and
- a circulator for leading a microwave outputted from the solid state amplifier to the antenna and leading a reflected microwave from the antenna to the dummy load.

4. The plasma processing apparatus of claim 2, wherein the solid state amplifier has:

a sub-divider for dividing an input microwave into a multiplicity of microwaves;

a multiplicity of semiconductor amplifying devices for respectively amplifying the multiplicity of microwaves outputted from the sub-divider to respectively specified powers; and a combiner for combining microwaves whose powers are amplified by the multiplicity of semiconductor amplifying devices.

5. The plasma processing apparatus of claim 1, wherein the solid state amplifier has:

a sub-divider for dividing an input microwave into a multiplicity of microwaves;

a multiplicity of semiconductor amplifying devices for respectively amplifying the multiplicity of microwaves outputted from the sub-divider to respectively specified powers; and a combiner for combining microwaves whose powers are amplified by the multiplicity of semiconductor amplifying devices.

6. The plasma processing apparatus of claim 5, wherein the semiconductor amplifying devices are formed of power MOSFETs, GaAsFETs, or GeSi transistors.

7. The plasma processing apparatus of claim 1, wherein each of the plurality of antennas has a wave delay plate and a slot plate.

8. The plasma processing apparatus of claim 1, wherein the antenna section has:

a circular antenna provided at a center thereof;

plural approximately fan-shaped antennas which surrounds a periphery of the circular antenna; and a dividing plate for dividing the circular antenna and the plural approximately fan-shaped antennas from each other.

9. The plasma processing apparatus of claim 8, wherein the dividing plate is a metal member and grounded.

10. The plasma processing apparatus of claim 9, wherein in case of letting a wavelength of the microwave be $\lambda_1$; and a relative dielectric constant of the wave delay plate, $\in_r$; and defining $\lambda g=\lambda_1/\in_r^{1/2}$, the circular antenna is provided with first slots of a predetermined length disposed along a circle located inwardly by λg/4 from the periphery of the circular antenna and second slots of a specified length disposed on one or more concentric circles located inwardly at intervals of λg/2 from the first slots and each of the plural approximately fan-shaped antennas is provided with third slots of a preset length located inwardly by λg/4 from respective boundaries between the approximately fan-shaped antennas and fourth slots of a specific length located inwardly at intervals of λg/2 from the third slots.

11. The plasma processing apparatus of claim 8, wherein in case of letting a wavelength of the microwave be $\lambda_1$; and a relative dielectric constant of the wave delay plate, $\in_r$; and defining $\lambda g=\lambda_1/\in_r^{1/2}$, the circular antenna is provided with first slots of a predetermined length disposed along a circle located inwardly by λg/4 from the periphery of the circular antenna and second slots of a specified length disposed on one or more concentric circles located inwardly at intervals of λg/2 from the first slots and each of the plural approximately fan-shaped antennas is provided with third slots of a preset length located inwardly by λg/4 from respective boundaries between the approximately fan-shaped antennas and fourth slots of a specific length located inwardly at intervals of λg/2 from the third slots.

12. The plasma processing apparatus of claim 1, further comprising a magnetic field generating unit for generating a magnetic field in the chamber, and wherein a magnetron effect is produced by an electric field generated by the microwaves introduced into the chamber and the magnetic field generated by the magnetic field generating unit.

* * * * *